(12) United States Patent
Cable et al.

(10) Patent No.: US 7,843,976 B2
(45) Date of Patent: Nov. 30, 2010

(54) COMPACT MULTIMODE LASER WITH RAPID WAVELENGTH SCANNING

(75) Inventors: Alex Ezra Cable, Newton, NJ (US); Johan Michael Larsson, Gothenburg (SE); Lars Goran Sandstrom, Askim (SE); Bengt Kleman, Gothenburg (SE)

(73) Assignee: Thorlabs, Inc., Newton, NJ (US)

( * ) Notice: Subject to any disclaimer, the term of this patent is extended or adjusted under 35 U.S.C. 154(b) by 0 days.

(21) Appl. No.: 11/339,451

(22) Filed: Jan. 24, 2006

(65) Prior Publication Data
US 2006/0203859 A1    Sep. 14, 2006

Related U.S. Application Data

(60) Provisional application No. 60/647,078, filed on Jan. 24, 2005.

(51) Int. Cl.
*H01S 3/10* (2006.01)
(52) U.S. Cl. .............. 372/20; 372/24; 372/72; 372/92; 372/93; 372/98; 372/99; 372/101; 372/102
(58) Field of Classification Search ............ 372/20, 372/24, 92, 93, 98, 99, 101, 102, 72
See application file for complete search history.

(56) References Cited

U.S. PATENT DOCUMENTS

| | | | | |
|---|---|---|---|---|
| 4,490,823 A | * | 12/1984 | Komine et al. | 372/95 |
| 4,913,525 A | * | 4/1990 | Asakura et al. | 359/559 |
| 5,077,747 A | * | 12/1991 | Hemmer et al. | 372/20 |
| 5,224,200 A | * | 6/1993 | Rasmussen et al. | 385/146 |
| 5,321,501 A | | 6/1994 | Swanson et al. | |
| 5,428,635 A | * | 6/1995 | Zhiglinsky et al. | 372/92 |
| 5,459,570 A | | 10/1995 | Swanson et al. | |
| 5,771,252 A | * | 6/1998 | Lang et al. | 372/20 |
| 5,862,162 A | * | 1/1999 | Maeda | 372/20 |
| 5,956,355 A | | 9/1999 | Swanson et al. | |
| 6,005,878 A | * | 12/1999 | Kung et al. | 372/22 |

(Continued)

FOREIGN PATENT DOCUMENTS

DE    199 09 497 C1    1/2001

(Continued)

OTHER PUBLICATIONS

Arroyo, M.P. and Hanson, R.K., "Absorption measurements of water-vapor concentration, temperature, and line-shape parameters using a tunable InGaAsP diode laser," *Applied Optics* 32(30):6104-6116 (1993).

(Continued)

*Primary Examiner*—Minsun Harvey
*Assistant Examiner*—Yuanda Zhang
(74) *Attorney, Agent, or Firm*—Graham Curtin, PA

(57) ABSTRACT

In accordance with the present invention, a compact laser system with nearly continuous wavelength scanning is presented. In some embodiments, the compact laser system can be scanned over a broad range. In some embodiments, the compact laser system can be scanned at high scan rates. In some embodiments, the compact laser system can have a variable coherence length. In particular, embodiments with wavelength scanning over 140 nm with continuously variable scan rates of up to about 1 nm/µs, and discrete increase in scan rates up to about 10 nm/µs, and variable coherence lengths of from 1 mm to about 30 mm can be achieved.

20 Claims, 6 Drawing Sheets

U.S. PATENT DOCUMENTS

| | | | | |
|---|---|---|---|---|
| 6,038,239 | A | * | 3/2000 | Gabbert .................... 372/20 |
| 6,141,360 | A | * | 10/2000 | Kinugawa et al. ............ 372/20 |
| 6,396,605 | B1 | * | 5/2002 | Heflinger et al. ............ 398/140 |
| 6,665,321 | B1 | * | 12/2003 | Sochava et al. .............. 372/20 |
| 6,690,686 | B2 | * | 2/2004 | Delfyett et al. .............. 372/20 |
| 6,822,982 | B2 | * | 11/2004 | Yoshida et al. .............. 372/20 |
| 6,853,654 | B2 | * | 2/2005 | McDonald et al. ............ 372/20 |
| 6,856,632 | B1 | * | 2/2005 | Heanue et al. ............... 372/20 |
| 6,897,992 | B2 | * | 5/2005 | Kikuchi .................... 359/237 |
| 7,035,298 | B2 | * | 4/2006 | Vodopyanov et al. ......... 372/22 |
| 7,106,778 | B2 | * | 9/2006 | Reid et al. .................. 372/96 |
| 2001/0026574 | A1 | * | 10/2001 | Yagi ........................ 372/102 |
| 2003/0165164 | A1 | * | 9/2003 | Delfyett et al. .............. 372/18 |
| 2003/0179789 | A1 | * | 9/2003 | Pilgrim et al. .............. 372/20 |
| 2004/0004979 | A1 | * | 1/2004 | Lin ........................... 372/20 |
| 2004/0264515 | A1 | | 12/2004 | Chang et al. |
| 2005/0068996 | A1 | * | 3/2005 | Narayan .................... 372/20 |
| 2005/0094681 | A1 | * | 5/2005 | Miyaki et al. ............... 372/20 |
| 2005/0213618 | A1 | * | 9/2005 | Sochava et al. .............. 372/20 |
| 2006/0092995 | A1 | * | 5/2006 | Frankel et al. .............. 372/18 |

FOREIGN PATENT DOCUMENTS

WO    WO 2006/079100 A2    7/2008

OTHER PUBLICATIONS

Chinn, S.R. et al., "Optical coherence tomography using a frequency-tunable optical source," *Optics Letters* 22(5):340-342 (1997).

Choma, M.A. et al., "Sensitivity advantage of swept source and Fourier domain optical coherence tomography," *Optics Express* 11(18):2183-2189 (2003).

Huber, R. et al., "Amplified, frequency swept lasers for frequency domain reflectometry and OCT imaging: design and scaling principles," *Optics Express* 13(9):3513-3528 (May 2, 2005).

Huber, R. et al., "Three-dimensional and C-mode OCT imaging with a compact, frequency swept laser source at 1300 nm," *Optics Express* 13(26):10523-10538 (Dec. 26, 2005).

Kranendonk, L.A. et al., "Modeless operation of a wavelength-agile laser by high-speed cavity length changes," *Optics Express* 13(5):1498-1507 (Mar. 7, 2005).

Olsson, A. and Tang, C.L., "Coherent Optical Interference Effects in External-Cavity Semiconductor Lasers," *IEEE J. Quantum Elec.* QE-17(8):1320-1323 (1981).

Richter, P.I. and Hansch, T.W., "Diode lasers in external cavities with frequency-shifted feedback," *Optics Comm.* 85:414-418 (1991).

Snyder, J.J., "Paraxial ray analysis of a cat's-eye retroreflector," *Applied Optics* 14(8):1825-1828 (1975).

Choma et al., "Sensitivity Advantage of Swept Source and Fourier Domain Optical Coherence Tomography", *Optics Express*, vol. 11, No. 18, Sep. 8, 2003, pp. 2183-2189.

International Search Report and Written Opinion mailed Sep. 24, 2007, for International Application No. PCT/US2006/002609.

International Preliminary Report on Patentability mailed Oct. 25, 2007, for International Application No. PCT/US2006/002609.

Extended European Search Report mailed Mar. 26, 2009, in related European Patent Application No. 06719461.3.

* cited by examiner

COMPACT MULTIMODE LASER WITH RAPID WAVELENGTH SCANNING

RELATED APPLICATIONS

The present application claims priority to U.S. Provisional Application No. 60/647,078, "Compact Laser with Continuous Wavelength Scanning," by Alex Cable, Michael Larsson, Lars Sandstrom, and Bengt Kleman, filed on Jan. 24, 2005, which is herein incorporated by reference in its entirety.

BACKGROUND

1. Field of the Invention

The present invention is related to a tunable multimode laser and, in particular, to a compact laser with mode-hopping wavelength scanning.

2. Discussion of Related Art

External Cavity Lasers (ECLs) are now commonly used in several applications where a continuously tunable laser source is needed. Although there are many commercial manufacturers of ECLs, covering a broad range of designs on the market, there are still many applications that would benefit from a dramatic increase in the tuning speed that current designs cannot offer, even if this increase comes at the expense of other operating parameters of the system such as the dynamic coherence length and power stability.

More specifically, fast ECLs with tuning speeds greater than 1,000,000 nm/s, tuning ranges of at least 5% of the center wavelength, and coherence lengths of at least several millimeters are not currently available commercially. Lack of wavelength tuning speed is a major disadvantage in present ECLs in that there are many applications that would benefit from substantially increased tuning speeds. Current ECLs, for example, may have a sufficient tuning range and also a truly single-mode behavior, and thus a coherence length of significantly more than a few millimeters (often many meters), but their tuning speed is limited to approximately 1,000 nm/s or less.

Note that there are tunable lasers that offer rapid, highly precise wavelength switching. For example, Syntune of Kista Sweden offers one such switchable laser that is capable of point-to-point wavelength switching times of less than 50 ns. However, such systems do not offer continuous sweeping of their output wavelength. Instead, they move discretely from one wavelength to another without generating a well-defined wavelength during the time interval required to move from one stable wavelength to another. Further, the Syntune laser requires a significant manufacturing infra-structure and is not easily implemented at new wavelengths. Another product that has some of the desired characteristics is offered by Micron Optics. The Micron Optics system is referenced in a scientific article that appeared in Optics Express, 8 Sep. 2003, Vol. 11, No 18, pages 2183 to 2189. The Micron Optics source provided 2 mW of optical power, a sweep time of 3.5 ms, a center wavelength of 1308 nm, and a FWHM (full width half maximum) sweep bandwidth of 87 nm. The Micron Optics system, assuming that the total swept range (defined as the 99% power points) is approximately twice the FWHM sweep bandwidth of 87 nm, results in a sweep speed of approximately 50,000 nm/s. The Micron Optics system, however, utilizes an intra-cavity fiber optic element and is susceptible to unwanted polarization variations as well as being limited to tuning speeds much less than that required by high-speed applications. Additionally, the Micron Optics system is a fiber based laser and as such it is difficult to make the cavity sufficiently short to enable very high tuning rates. The length of a tunable laser determines the transit time of a photon or a group of photons. If a group of photons of a specific wavelength takes too long in transiting the laser, when they return to the filter element the filter element could be tuned to another wavelength and hence provide unwanted attenuation of the laser action. The article by R. Huber et. al. in Optics Express 2 May 2005 V13, No 9 page 3513 to 3528 provides a more complete description of this limitation.

The typical design solution for an ECL is to provide a mirror or grating rotatable around a pivot axis that can be rotated to hold the laser in the same longitudinal mode over the laser's entire tuning range. The pivot axis is chosen such that both equation 1 and equation 2, shown below, can be simultaneously satisfied:

$$\lambda_N = d(\sin \alpha + \sin \beta), \quad (1)$$

$$N\lambda_N = 2L. \quad (2)$$

In Equations 1 and 2, $\lambda_N$ is the average instantaneous output wavelength of the laser, N is the longitudinal mode number of the laser, d is the grating constant measured in the same units as the wavelength, $\alpha$ is the angle of incidence of the light field upon the grating, $\beta$ is the angle of diffraction of the light field off the grating, and L is the optical path length of the laser cavity. If the two conditions of Equations 1 and 2 are simultaneously fulfilled during the wavelength tuning with N fixed, the resulting laser will tune continuously and without any longitudinal mode hops. While there are several mechanical solutions that may satisfy the requirements of the two equations shown above, those that are found commercially or in the scientific literature are limited, due to their size, to tuning speeds significantly below the desired tuning speeds. The mechanics required to rotate a mirror or grating in accordance with the Equation 2 above with N fixed are almost always complicated mechanisms that have large inertial mass, which prevents them from being actuated at the high speeds required for rapid tuning.

To our knowledge, the fastest commercially available continuously swept single longitudinal mode tunable laser is offered by New Focus and is advertised as providing 1000 nm/s scan speeds. In order to reach the desired scan speeds of 1,000,000 nm/s, the moving optical element, which is typically a mirror or optical grating, is best rotated around its center of mass and is best kept as small as possible. Utilizing a resonant scanner provides a convenient means to achieve both these objectives; however this method typically has the rotation axis centered on the moving optical element, and Equation 2 cannot generally be met when N is held constant. In other words, the longitudinal mode condition $N\lambda_N=2L$ cannot be satisfied continuously, and the laser radiation will jump from one longitudinal mode to another when the tuning range is significant enough to be of interest.

The mode jump can be one or several mode distances wide, the mode distance being:

$$\Delta\lambda = \lambda^2/2L.$$

With these mode jumps present, the laser will no longer be a continuously tunable laser, and the dynamic coherence length of the laser will become erratic and degrade below the static coherence length of the system. In order to reduce the size of the mode jump, the cavity length can be increased, but that will also make the laser more disposed to multimode behavior and thus also contribute to a short coherence length.

In U.S. Pat. No. 5,956,355 (the '355 patent), a laser design in which the length of the cavity of a widely tunable single mode laser is adjusted to compensate for changes in wavelength is disclosed. The '355 patent disclosed that the laser could be made to provide nearly continuous frequency tuning through an appropriate choice of the laser cavity components and geometry while also offering a high scan rate. The method proposed in the '355 patent used a steerable mirror and a diffraction grating-which provided the wavelength selectivity-oriented such that the steerable mirror sweeps the light field across the grating in such a way to have the cavity length change to offset the changes in wavelength with the goal of maintaining a near balance in Equation 2 above, with N held constant. It was further proposed in the '355 patent that an additional element could be added such that the residual error or imbalance in Equation 2 could be accounted for such that a precise balance of Equation 2 could be maintained across a broad tuning range. While this approach seems feasible, to our knowledge, there has been no successful implementation of this proposed design.

The instantaneous coherence length of a wavelength swept laser can be measured utilizing one of several methods, usually involving different kinds of interferometers. One such method is to utilize a fiber based Michelson interferometer. The coherence length, $L_c$, is given by:

$$L_c = 2 \times HWHM,$$

were HWHM is the displacement of one of the mirrors in the interferometer required to change the interferogram from 100% of maximum to 50% of maximum. Note that the factor of 2 accounts for the double pass (forward and backward) in the moving arm of the Michelson interferometer.

There is a need in many applications to simultaneously reach high nearly continuous-tuning speeds and dynamic coherence lengths of at least a few millimeters. This is the case in Swept Source Optical Coherence Tomography (SS-OCT) as well as in some optical remote fiber sensing and optical component testing applications. In SS-OCT the coherence length of the source sets a limit on the imaging depth, with the potential imaging depth scaling linearly with the coherence length.

SUMMARY

In accordance with the present invention, a nearly continuous wavelength scanning multimode laser is presented that has a large scanning rate while maintaining sufficient coherence length to be utilized in swept-source applications. In some embodiments of the present invention, a compact laser light source can have a wavelength scanning range of over about 140 nm with variable scan rates of up to about 10 nm/µs and a coherence length of between about 3 mm to about 30 mm.

Instead of trying to maintain a single longitudinal mode or nearly single longitudinal mode as the laser is scanned in wavelength, as is attempted in other systems as described above, some embodiments of the present invention provide a laser design that is intentionally multimode. Additionally the tuning mechanism according to some embodiments of the present invention is such that as the laser is tuned in wavelength the family of longitudinal cavity modes changes significantly, by sometimes many tens of thousands of modes.

A compact laser system according to some embodiments of the present invention includes an optical cavity, a light generating and optical gain medium section, and a beam shaping optical system; an optical propagation medium; and a fast mechanical wavelength tuning section positioned to receive light from the light generating section and the optical propagation medium, the fast mechanical wavelength tuning section-including a dispersive part-to retro reflect selected wavelengths of light to the optical propagation medium, and the light generating section, wherein the wavelength of the laser system can be scanned. In some embodiments the first end-reflector of the optical cavity is created from one end of the light generating and optical gain medium. In some embodiments the second end-reflector of the optical cavity is embedded within the fast mechanical wavelength tuning section. In some embodiments the second end-reflector of the optical cavity is a separate optical element. In some embodiments, the fast mechanical wavelength tuning section includes a dispersive part, a spectral optical filtering part, and a reflector part. In some embodiments, the reflector part is the dispersive part. In some embodiments, the reflector part serves as a second end-reflector of the laser system cavity. In some embodiments, the reflector part is combined with the spectral optical filtering part. In some embodiments, the total optical path length of the cavity is as short as 25 mm. In some embodiments the total optical path length of the cavity can be varied from 25 mm to many meters.

These and other embodiments are more fully discussed below with respect to the following figures.

Components and other details of one and the same type have a consistent numbering in the different figures. The first digit in the number refers to the numbering of the figure and the following digits refer to the specific type of component or detail.

DETAILED DESCRIPTION

In accordance with some embodiments of the present invention, a tunable laser system that provides more than 5 mW of average optical power delivered from a single mode optical fiber, a dynamic coherence length of greater than about 2 mm, a tuning range (measured at the 99% power points) of approximately 5% of the center wavelength when operating at a center wavelength of, for example, about 850 nm, and approximately 10% of the center wavelength when operating at a center wavelength of, for example, about 1330 nm, and a tuning speed that is continuously variable from 0 to about 2,000,000 nm/s is presented. In some embodiments, additional discrete increases in tuning speed up to about 10,000,000 nm/s can also be obtained with the upper limit on the tuning speed being limited by the availability of appropriate high speed scanners or high speed tunable optical filters. In some embodiments, the polarization state of laser light emitted from the laser is linearly polarized and highly stable. Once coupled into a single mode fiber, the polarization state can easily be controlled via a manual polarization controller. The intensity profile as a function of wavelength can have a shape that is very roughly Gaussian and can be further shaped to better follow a Gaussian profile by electrically controlling the drive current applied to, for example, a semiconductor-based gain element. Examples of applications that would benefit from the improved performance offered by rapidly scanned tunable lasers such as is provided by some embodiments of the present invention include metrology, spectroscopy, medical imaging, and any other optical technique that requires a source of rapidly tuned laser light with coherence lengths in the range of about 2 mm to about 50 mm.

Figure 1:
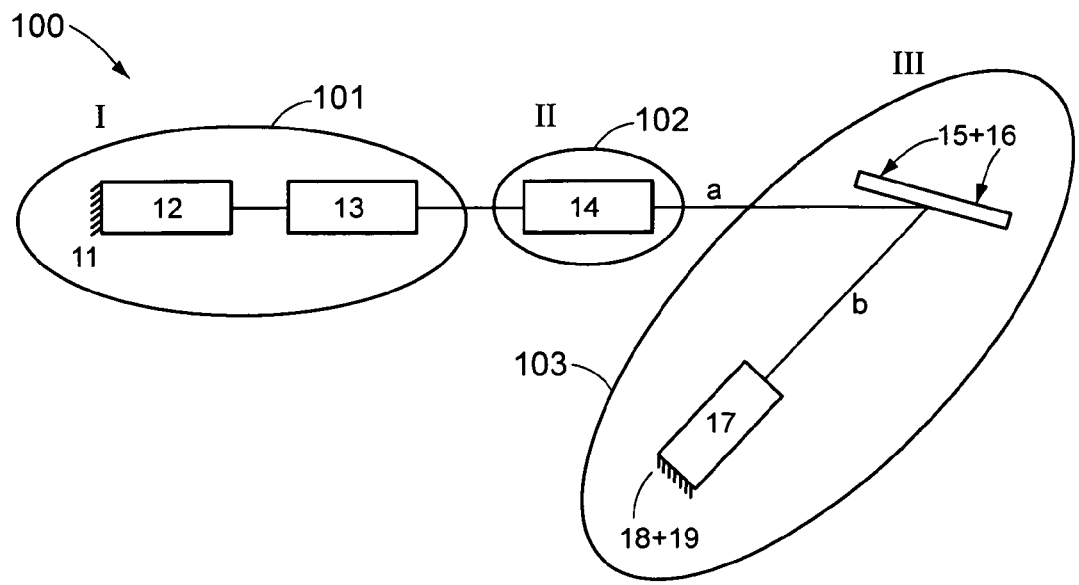
FIG. 1 illustrates an embodiment of laser system according to the present invention.

FIG. 1 shows a light source 100 according to some embodiments of the present invention. As shown in FIG. 1, a light source according to the present invention includes a light generating section 101, a transmission section 102, and a tuning element section 103. In some embodiments of the present invention, light generating section 101 can include a gain element with the intra-cavity side having a curved waveguide and an anti-reflective (AR) coated outer surface or facet which suppresses self-lasing and allows the element to serve as an effective gain medium for an external cavity laser. And the other facet of the gain element can include a partially reflecting surface, for example with a reflectivity of approximately 20%, which serves as the output coupler of the laser. In some embodiments of the invention, both sides of the gain element can be AR coated and the mirror defining one side of a laser cavity can be positioned appropriately relative to the gain element. In some embodiments, the output coupler reflectivity can range from approximately 10% to 50%.

Light-generating section 101, in some embodiments, can be of the conventional type for extended cavity laser systems. Such systems typically include a first optical cavity end-reflector that is often, but not always, one of the outer surfaces of a broadband gain element. The other surface of the gain element emits a divergent light field that is collimated with a short focal length lens. Light generation section 101 may be referred to herein as the light-generation section or as simply "the first section" and may contain any number of gain elements to achieve lasing at various wavelengths. The active laser gain medium can be made, for example, from semiconductors, e.g. gallium arsenide (GaAs), indium gallium arsenide (InGaAs), gallium nitride (GaN), indium phosphide/indium gallium arsenide phosphide (InP/InGaAsP), and indium phosphide/indium gallium arsenide/indium gallium arsenide phosphide (InP/InGaAs/InGaAsP); certain glasses (e.g. silicate or phosphate glasses), including both bulk glasses and optical fibers, typically doped with some rare-earth ions (e.g. of neodymium, ytterbium, or erbium) or transition metal ions (e.g. of titanium or chromium); certain optical crystals, also doped with some laser-active ions; gases, e.g. mixtures of helium and neon, nitrogen, argon, carbon monoxide, carbon dioxide, or metal vapors; or liquid solutions of certain dyes.

The beam shaping optics of light generation section 101 can be chosen from a broad selection of optical elements commonly used to shape or collimate the output of a laser diode. The collimation lens, which can be, for example, a GRIN lens or an aspheric lens, are used with the focal length of the optic chosen to provide full illumination of the optical grating when that is the element chosen to provide the wavelength dispersion. If the first optical cavity end-reflector is not attached to the gain element, but is a separate optical element, then an additional collimation lens could be used to collimate the light emitted from the first surface of the gain element. The beam shaping optics can be, for example, an anamorphic prism pair or cylindrical lens.

Embodiments of light sources according to the present invention are arranged to form multimode lasers as opposed to the conventional single mode operations. A multimode laser is a laser having multiple longitudinal modes (i.e., a number of discrete wavelengths that in aggregate make up the lineshape of the laser). In general, changing the length of the cavity, the filter function of the cavity, the gain, the loss, the alignment, or the reflectivity properties of the end-mirrors of a laser cavity changes the number of modes that can lase within the cavity (the last three of these change the number of modes by changing the lasing threshold). As used in the present invention, the term "gain medium" can be any element that provides optical gain, including semiconductor elements, rare-earth doped optical fiber based amplifiers, organic dyes, or other material. The terms "wavelength swept," wavelength tuned," "frequency tuned," "frequency swept," and "wavelength agile" are generally understood to be interchangeable. When referred to, the "cavity filter function" is the effective filter function of the entire laser cavity after it has been assembled, measured by measuring the spectral properties of the light that is emitted from the system with the light source operating below the lasing threshold. The terms "optical source" and "laser system" or "laser" are herein utilized interchangeably.

In general, a light source according to the present invention includes a laser built from two cavity end-mirrors, a gain element, and a tunable wavelength selecting device. These components are brought together into a configuration in which both the cavity length (which sets the mode spacing) and the filter function of the cavity are predetermined such that the laser provides the desired output characteristics. The main components also form a multimode laser; the task of correctly specifying each of the elements to achieve the unique characteristics of a light source with a coherence length greater than about 2 mm while providing for sweep speeds of up to about 10,000,000 nm/s over a wavelength range that is approximately 5% of the center wavelength of the laser is exemplified below.

As shown in FIG. 1, in some embodiments of the present invention light generating section 101 can be followed by transmission section 102, which can be a free space section. Alternatively, transmission section 102 can contain a specific propagation medium, for example an optical fiber. One advantage of using an optical fiber is to allow light sources according to the present invention to be further compressed in size as well as to provide additional wavelength selectivity within the cavity of the light source such as source 100. In some embodiments, the length of transmission section 102 can be adjusted from just a few millimeters to many meters to adjust the mode spacing of the laser light source 100 as well as the average time a photon spends in the cavity of light source 100.

Light propagation section (or second section) 102 can either be free space or a medium such as a single mode or single mode polarization preserving optical fiber. Second section 102 can form the major part of the optical path within the optical cavity of the light source. In some embodiments, the length of second section 102 can be adjusted to optimize the performance of the laser system of the light source according to the present invention. As the length is changed, the longitudinal mode distance in the optical cavity as well as the coherence properties of the light source change. For each embodiment of light source, the length of the cavity can be adjusted until the laser performance is optimized in terms of coherence length, tuning range, and optical power. The performance of laser cavities with various length settings for the second section have been explored experimentally; the results indicate that acceptable performance can be obtain over a very broad range of distances. Embodiments of the light source with short cavity lengths, e.g. <50 mm, good overall performance can be obtained when the external cavity is well aligned to provide efficient coupling of the filtered light back into the gain element of first section 101. This efficient coupling ensures that the residual reflections from the intra-cavity side of the gain element do not cause an unwanted amplitude modulation of the output power as a function of wavelength. Poor alignment or a significant residual reflection from the intra-cavity facet or facets of the gain element can lead to amplitude modulations as a function of wavelength in the output, which have a frequency given by the free spectral range of the gain element. At longer cavity lengths, e.g. >400 mm, the performance of the light source can still remain acceptable. However, as the length of the cavity is increased significantly beyond this level the scan rate of the resulting light source can become limited. This effect is attributed to the fact that the cavity needs sufficient time to allow each wavelength to realize a sufficient number of passes around the cavity in order to achieve sufficient gain to sustain an appreciable output power. Hence, the tuning speed of the optical source has an upper limit that is related to the cavity length, the gain characteristics of the gain element, and the losses in the external cavity optics including the coupling losses back into the gain element.

A fast wavelength-tuning section 103 receives light from the light-generating section 101 that is passed through transportation section 102. This fast wavelength-tuning section 103 spectrally filters and retro-reflects selected wavelengths of light to light generating section 101. Tuning section 103 can include, in addition to a wavelength selective component, a spectral-optical-filtering-and-reflector device. The reflector part of the spectral-optical-and-filtering device can serve as a second optical end-reflector of the cavity of the laser system.

Tuning section (or third section) 103 includes a tuning element or elements and a supplemental spectral filtering element or elements which receives light from transportation section 102. Third section 103 acts to provide both the enhanced spectral filtering of the cavity light while also providing the tuning system for the laser. Third section 103 also provides a high efficiency retro-reflection required to form the laser resonator of the light source. Third section 103 provides the selected wavelengths of the intra-cavity light field that are returned to the first section of the system for amplification.

Some specific embodiments of light sources according to the present invention are discussed below with discussion of individual components of light generating section 101, transport section 102, and tuning section 103. The performance of some of the embodiments have been studied experimentally, and the anticipated scanning speed and tuning at a high frequency repetition rate, i.e., number of scans per second covering the relevant wavelength range independent of scan direction, up to about 16 kHz, with a coherence length of 11 mm or more has been demonstrated. Further, at slower tuning speeds the coherence length increased.

Some embodiments of light source according to the present invention form a tunable external cavity laser system with an output power in the milliwatt range, a coherence length of a couple of millimeters to a couple of tens of millimeters, and an upper tuning speed that would enable video rate acquisition of images in a SS-OCT system. The usefulness of various embodiments of the invention, however, is not limited to tomographic applications, and laser system according to some embodiments of the invention may also be of interest in other measurement applications that require high speed tunability of a coherent source of optical radiation.

Figure 6:
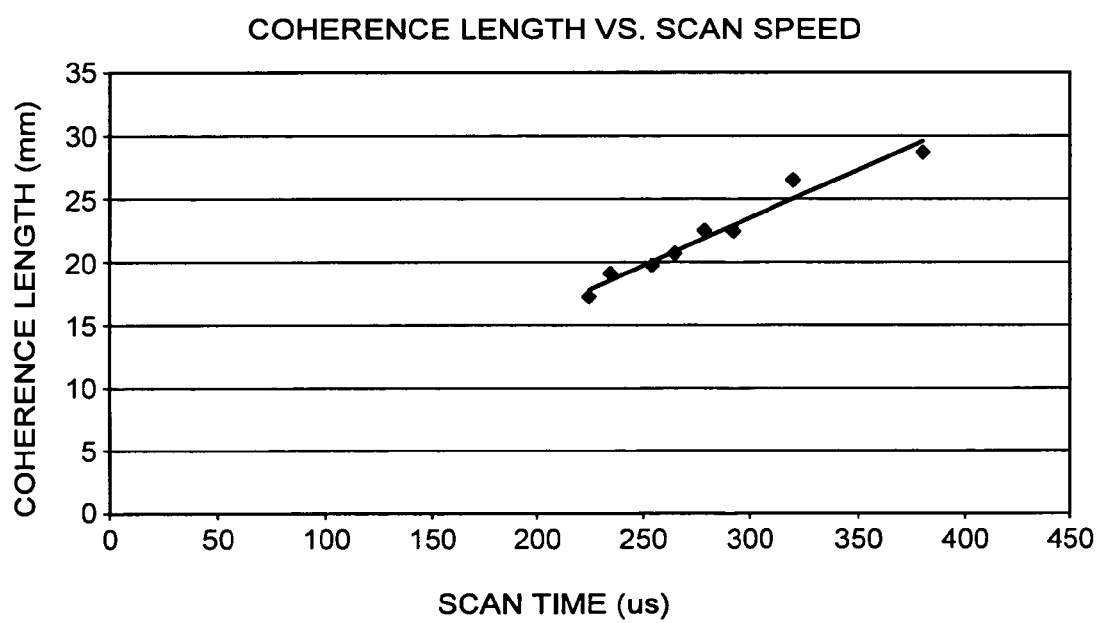
FIG. 6 illustrates the coherence length versus scan speed for some embodiments of laser system according to the present invention.

Some embodiments of the present invention utilize a moderate length cavity, with a round trip cavity length of approximately 0.1 meter to approximately 1 meter, along with a supplemental spectral filter that narrows the filter function of the cavity while also acting as a high efficiency retro-reflector. The cavity length of the light source is adjusted for a given spectral filter such that the desired performance characteristics of the laser are optimized; these could be coherence length, optical output power, optical output intensity noise, as well as the size and weight of the light source. In general the narrower the pass band of the spectral filter, the longer the coherence length; however, the desire to obtain a high output power from the laser typically provides a lower limit on the pass band of the supplemental spectral filter. The additional spectral filter is referred to as a supplemental filter because in most commercially available ECL designs the aperture of the gain element along with the optical grating typically found in the laser cavity both act to form the primary spectral filtering element. The present invention achieves tuning speeds of from about 1000 nm/s to about 10,000,000 nm/s with the coherence length decreasing as the tuning speed is increased for a specific laser cavity configuration. When operating at approximately 2,000,000 nm/s a coherence length from an example light source according to the present invention of approximately 12 mm was obtained. These measurements were for a system operating with a center wavelength of 1.33 µm and a tuning range of approximately 130 nm. FIG. 6 shows the coherence length as a function of tuning speed for a system with a fixed filter function but a continuously variable scan speed.

One embodiment of the present invention was tested within an SS-OCT imaging system; the design of this particular laser is detailed in the following paragraphs. Details on the results of the OCT imaging study have been published in R. Huber et al. Optics Express 26 Dec. 2005 V13, No 26 page 10523 to 10538 ("Huber et al."), which is herein incorporated by reference in its entirety.

Figure 8:
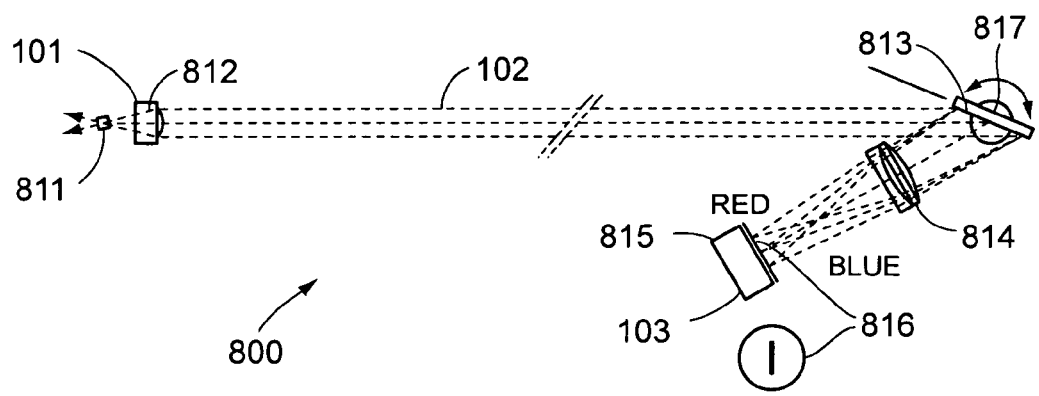
FIG. 8 illustrates a schematic representation of a light source according to the present invention.
Figure 9:
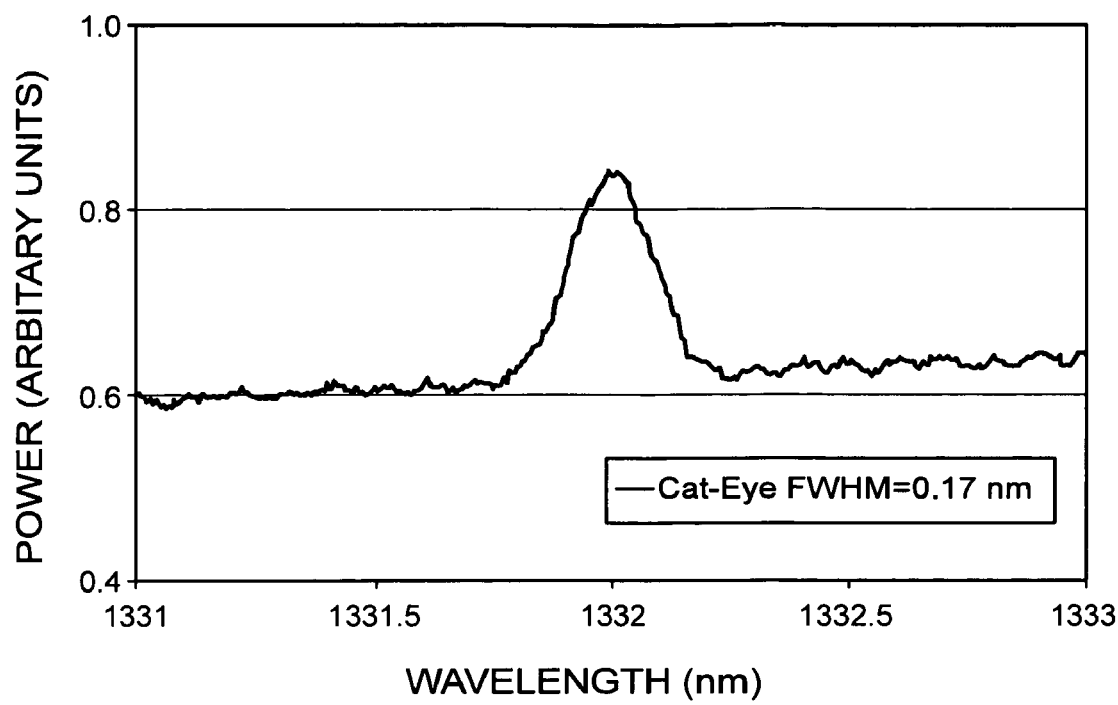
FIG. 9 shows a filter function for the cavity of a light source such as that illustrated in FIG. 8.

FIG. 8 shows a schematic representation of a light source 800 according to the present invention. An embodiment of light source 800 was tested and several test results are provided below. Further, a system designed as in light source 800 was utilized to perform the measurements included in Huber, et al. As shown in FIG. 8, light generation section 101 includes gain element 811 and aspheric lens 812. Gain element 811 can be approximately 1 mm in length with an estimated index of refraction of about 3.5. In some embodiments, gain element 811 can be formed of InP/InGaAsP semiconductor optical amplifier. The left facet of gain element 811 serves as the output coupler for light source 800; the left facet (or output facet) reflectivity of gain element 811 in some embodiments is estimated to be in the range of about 15% to about 20%. As discussed above, in some embodiments of light source according to the present invention, the left facet of gain element 811 can be an anti-reflection (AR) coated and coupled, potentially through other optics, to a reflector. The reflector may be an output coupler but in some embodiments may form the substantially reflecting end of the resulting laser cavity.

Gain element 811 can, in some embodiments, be bonded to a thermo-electric (TE) cooler to maintain a constant temperature. In some embodiments, gain element 811 can be maintained at a temperature of approximately 22° C.

The intra-cavity side of gain element 811 can utilize a curved waveguide and an AR coated facet. In some embodiments, an estimated effective intra-cavity facet reflectivity of approximately $10^{-4}$ is achieved, which suppresses self-lasing and allows element 811 to serve as a more effective gain medium for the external cavity of light source 800. Light from gain element 811 is coupled into aspheric lens 812. In some embodiments, aspheric lens 812 can have a 2 mm focal length and is AR coated. In some embodiments, both optical surfaces of aspheric lens 812 can be convex.

In light source 800, transportation section 102 is a free space region. In some embodiments, the free space region of transportation section 102 can be approximately 370 mm. The free space region of transportation section 102 can be utilized to adjust the overall length of the cavity formed in light source 800.

Light from the free space region of transportation section 102 is coupled into tuning section 103 of light source 800. Tuning section 103 includes grating 813, lens system 814, slit assembly 816, and mirror 815. In some embodiments, diffraction grating 813 can have a ruling density of about 1017 lines/mm. Diffraction grating 813 can be mounted on a resonant scanner 817 that provides an angular displacement and a particular operation frequency. For example, a resonant scanner 817 that provides a total angular displacement of approximately 14 degrees at 8 kHz can be obtained from Electro-Optical Products Corp.

Light from grating 813 can be coupled into lens system 814. In some embodiments, lens system 814 can be an achromatic doublet lens. In some embodiments, lens system 814 can be optimally arranged for operation at multiple wavelengths. For example, in some embodiments three wavelengths were used in the optimization of lens system 814: 1.0 µm, 1.3 µm, and 1.5 µm. In some embodiments, lens system 814 can have a 45 mm focal length.

Lens system 814 focuses light from scanner 813 onto slit 816. In some embodiments, slit 816 can be a 10 µm slit that is bonded directly onto the reflective surface of a broadband dielectric mirror 815. In some embodiments, mirror 815 can have a reflectivity of greater than about 98.5% over the complete operating range of light source 800 and is placed at the back focal plane of lens system 814. As such, the combination of mirror 815 and slit 816 form the back-reflector of a laser resonator of light source 800.

In some embodiments, light source 800 can be coupled into a collimating lens system (not shown). The collimating lens system may, for example, be an AR, coated aspheric lens, for example with a focal length of 0.7 mm. In some embodiments, light from the collimating lens system may be coupled into an isolator, for example a −55 dB optical isolator, that prevents back-reflections from re-entering the laser cavity of light source 800. In some embodiments, light from the isolator can be coupled through an aspheric lens into an optical fiber. For example, an AR coated, 4 mm focal length aspheric lens can be utilized to couple light into an AR coated single mode fiber.

Light source 800 can be wavelength sweep by rotating grating 813 with resonant scanner 817 as shown in FIG. 8. Resonant scanner 817 rotates grating 813 to sweep the various wavelengths across slit 816, thereby maintaining a constant cavity length as the laser is tuned. The laser dynamics of light system 800 can be understood by considering the situation where a single longitudinal mode is lasing within the cavity formed between mirror 815 and the partially reflective surface of gain element 811. If the rotation axis of grating 813 is perpendicular to the plane defined by the optical light field of light source 800 and the light field is centered about the rotation axis, the cavity length will be kept substantially constant when grating 813 is rotated. Therefore, there is no wavelength change within the cavity for very small rotations of grating 813. Once the rotation is sufficient to ensure that the next longitudinal mode has lower loss, the laser formed in light source 800 will hop to this next mode, and the center frequency of the laser is consequently shifted by one or a few longitudinal cavity modes which is given by the free spectral range of the cavity. In some embodiments, the free spectral range of the laser cavity is about 330 MHz. Further rotation of grating 813 leads to this pattern repeating itself, whereby the laser wavelength (i.e., the output frequency of light source 800) as a function of grating angle follows a "staircase" shaped tuning curve. In reality, the finite width of the filter function of grating 813 can allow many longitudinal modes, approximately 80 for some embodiments of light source 800, to lase simultaneously. Therefore, the laser generates a comb of frequencies that tune in a stepwise fashion with the step size being equal to the longitudinal mode spacing.

As shown in L. A. Kranendonk, R. J. Bartula, and S. T. Sanders, "Modeless operation of a wavelength-agile laser by high-speed cavity length changes," Opt. Express 13, 1498-1507 (2005), varying the cavity length at high speeds produces operation that is similar to the operation of a frequency shifted feedback laser, which is discussed in P. I. Richter and T. W. Hänsch, "Diode-Lasers in External Cavities with Frequency-Shifted Feedback," Opt. Commun. 85, 414-418 (1991). A value R is defined as the relative frequency change of the cavity modes with respect to their free spectral range during one optical roundtrip. The laser in the Kranendonk reference tunes in a modeless regime with a value R>>0.05 using a rapid change in cavity length that is intentionally introduced in order to achieve this modeless operation. In contrast, light source 800 and some other light sources according to the present invention tune with distinct cavity modes.

In light source 800 shown in FIG. 8, there is substantially no change in the cavity length while the laser is being tuned. As a result, the value R is substantially 0. This arrangement, therefore, provides an optimum build-up time for a mode structure, which has been demonstrated to provide a higher output power stability.

A number of other cavity designs were explored with non-zero values of R, and performance results were compared to that of an embodiment of light source 800 shown in FIG. 8. These designs had similar layouts with the same sequence of components, however with varying cavity lengths. The non-zero values of R were obtained by offsetting the optical axis from the axis of rotation of the diffraction grating. In each instance, the instantaneous coherence length was found to be shorter than for an embodiment of light source 800 such as that shown in FIG. 8.

To estimate the coherence properties of embodiments of light source 800 while it was being frequency tuned, the fringe contrast was measured while the output was coupled into a Michelson interferometer. The amplitude of the fringe signal was measured as a function of the interferometer arm length difference. A 3 dB drop over about 3.5 to 4 mm arm length difference in the Michelson interferometer was observed. The coherence length for the static case when the laser is not frequency scanned is determined by measuring the spectral linewidth of the output with an optical spectrum analyzer. A resolution limited static linewidth of <0.02 nm was measured, which corresponds to a coherence length of greater than about 8 cm.

The filter function of a cavity of light source 800 is taken with the injection current set to 45 mA, which is well below threshold for gain element 811 formed from an InP/InGaAsP semiconductor optical amplifier. In some embodiments, care was taken to ensure that the FWHM of the resulting lineshape did not change appreciably as the drive current was increased from the point at which the lineshape just started to emerge from the noise.

Figure 10:
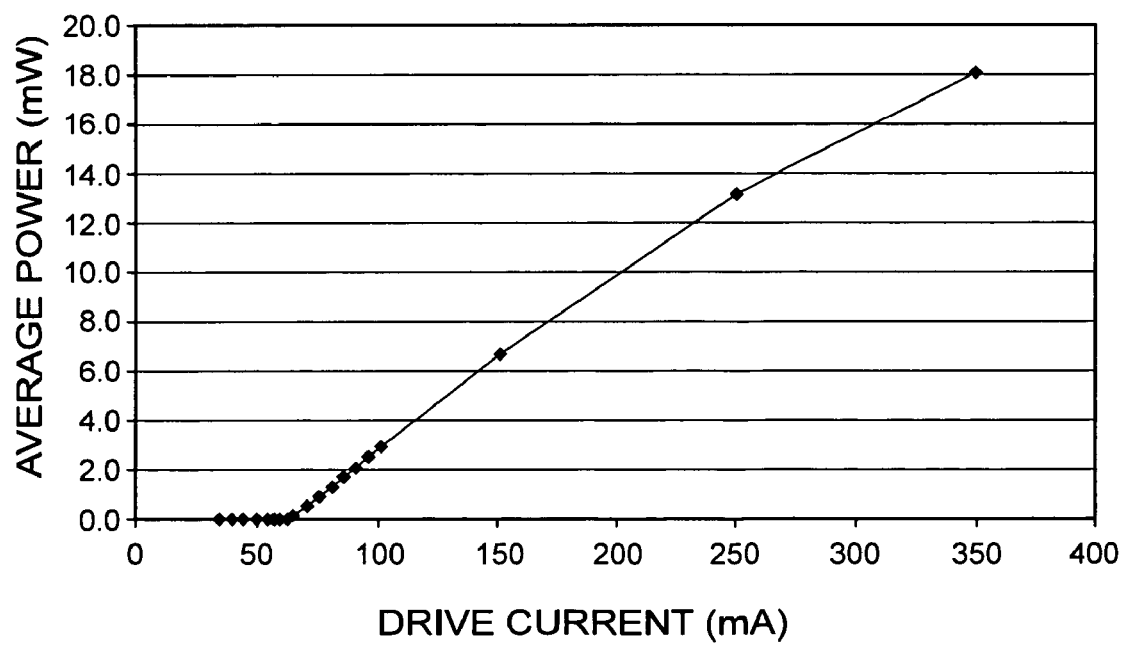
FIG. 10 illustrates the output power of an embodiment of a light source such as that illustrated in FIG. 8 as a function of drive current.

As shown in FIG. 8, utilizing a 10 μm slit for slit 816 limits the FWHM pass band of the cavity to approximately 0.17 nm. FIG. 8 was obtained with the location of the grating fixed in its center position. Care was taken to ensure that the FWHM of the filter function did not change appreciably as the current was increased from below threshold to the 45 mA used for this measurement. The laser threshold current was measured to be approximately 62.5 mA, as is shown in FIG. 10. FIG. 10 illustrates the output power of an embodiment of light source 800 as a function of drive current. FIG. 10 was obtained using a calibrated optical power meter. The threshold occurs at approximately 62.5 mA of injection current at a temperature of 22° C. The optical spectrum analyzer (OSA model Anritsu MS9710A) was set to its highest resolution of 0.07 nm and a VBW (video bandwidth) of 1 kHz was used for this measurement. As the current was increased beyond 62.5 mA, with the scanner still in the off position, the FWHM of the spectral profile narrowed quickly beyond the measurement resolution of the OSA. As expected the static linewidth of the laser is substantially smaller that the dynamic linewidth.

Figure 11:
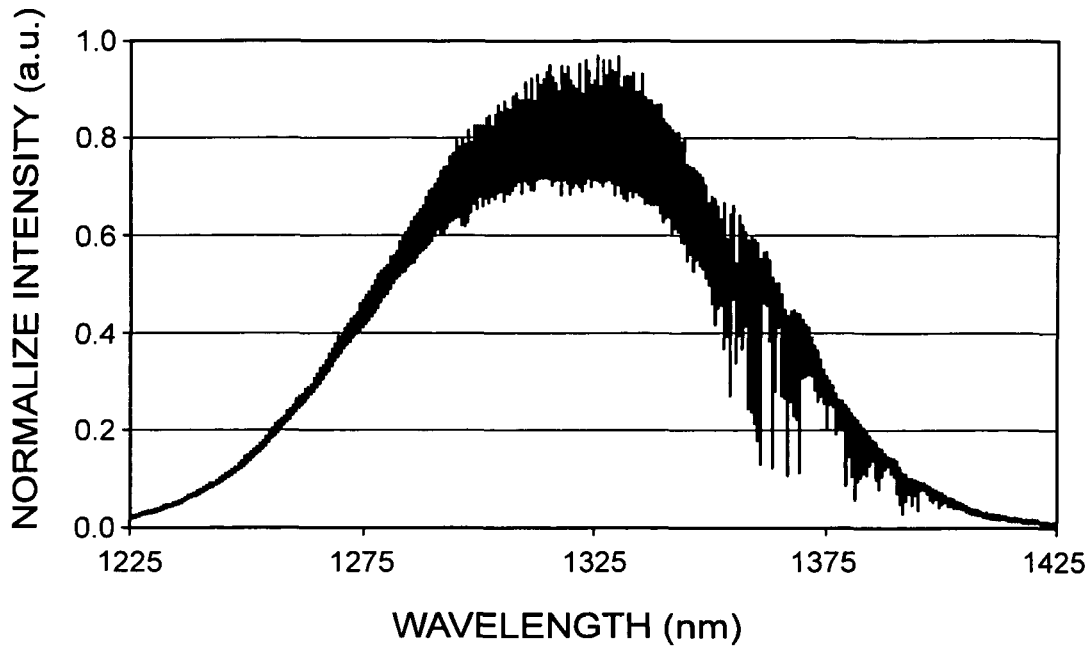
FIG. 11 is an OSA trace of the ASE spectrum of the gain element with the internal cavity blocked to prevent lasing for an embodiment of a light source such as that illustrated in FIG. 8.

FIG. 11 is an OSA trace of the ASE spectrum of the gain element with the internal cavity blocked to prevent lasing for an embodiment of light source 800 as discussed above. The injection current to the gain element was set to 300 mA, and the TE cooler that controls the temperature of the gain element was set for 22° C. The OSA resolution was set to 0.07 nm and 5,000 data points were acquired. The structure on the right side of the plot is assumed to be due to water vapor; both these absorption features as well as the intensity modulation that is apparent in this plot are discussed below.

The strong absorption lines apparent in FIG. 11 were confirmed to be a result of water vapor with the strongest lines occurring between 1340 and 1410 nm. See reference M. P. Arroyo, R. K. Hanson, "Absorption measurements of water-vapor concentration, temperature, and line-shape parameters using a tunable InGaAsP diode laser," App. Optics, V 32, No 30, (1993) pg 6104-6116. The effect of intra-cavity water vapor absorption losses on the quality of the OCT imaging capabilities of the system were investigated. The system was purged overnight with dry nitrogen. OCT images were taken before and after purging; when compared no discernable effects were noted. It is, however, anticipated that embodiments of light source 800 intended for wide scale use would need to be hermetically sealed in an inert atmosphere, as is the case for many commercially produced external cavity laser diode systems.

The fast intensity modulation apparent in FIG. 11 were found to correlate with the Fabry Perot modes of gain element 811 that result from the residual reflectivity of the intra-cavity facet. This modulation of the ASE spectrum leads to an amplitude ripple in the spectrum of the output of the frequency swept laser. Additionally, this artifact leads to unwanted anomalies in the OCT images. Both the quality of the AR coating on the intra-cavity facet and the total efficiency of the external cavity were found to significantly effect the magnitude of the ripple.

In order to ensure stable operation of these embodiments of light source 800 over a broad tuning range, as well as to fulfill the need to reduce the spectral ripple described above, strong feedback from the external cavity can be utilized. Strong feedback may be defined as the condition where $R_{EC} \gg R_{SG}$ where $R_{SG}$ is the reflectivity of the intra-cavity facet of gain medium 811, and REC is the effective reflectivity of the extended cavity when all optical elements, including the coupling losses of the feedback back into gain medium 811, are considered. See reference A. Olsson, C. L. Tang "Coherent Optical Interference Effects in External-Cavity Semiconductor Lasers," IEEE J. of Quantum Electronics QE-17 No 8, (1981) pp 1320. Therefore $R_{EC}$ is dependent upon the reflectivity of each of the optical surfaces within light source 800, as well as the spatial mode structure and alignment errors of the light field within the cavity.

Figure 12:
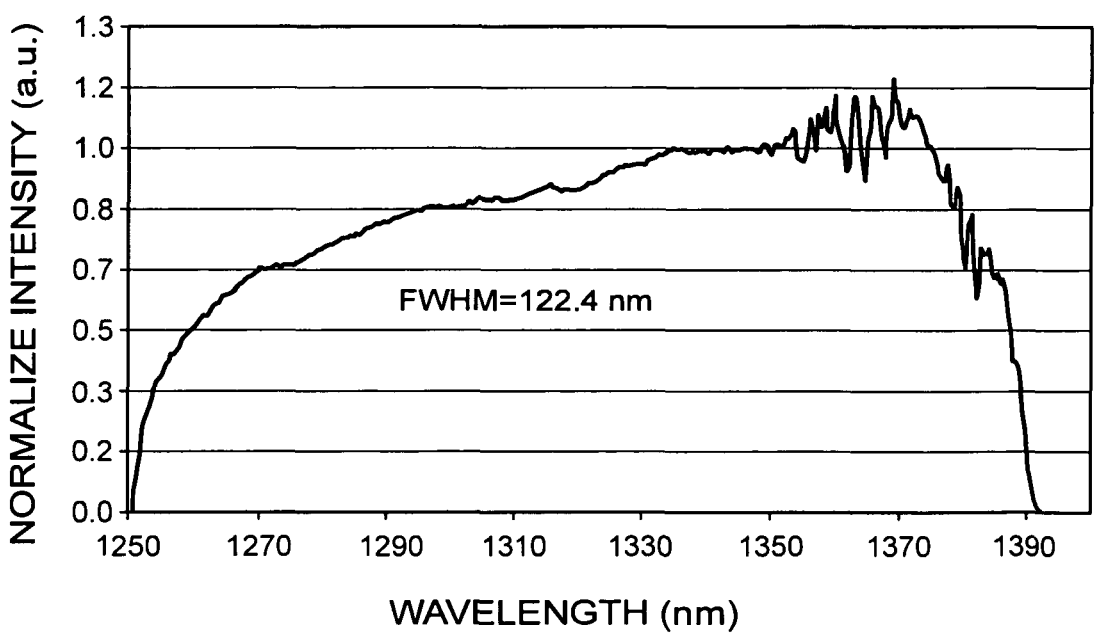
FIG. 12 illustrates an ASE spectrum of an embodiment of light source such as that illustrated in FIG. 8.

Light source 800, as shown in FIG. 8, partially ensures that $R_{EC}$ is relatively independent of the wavelength across the emission wavelength range of gain element 811 and also ensures that cavity length changes did not adversely effect the performance of light source 800. Light source 800 includes a lens 814 and mirror 815 combination that is typically referred to as a "cat's-eye" configuration, where mirror 815 is placed in the focal plane of lens system 814. The optical arrangement of light source 800 illustrated in FIG. 8 can provide a reduced sensitivity of the feedback to angular misalignments of the retro-reflector while also ensuring good optical performance over the entire ASE spectrum of gain element 811. See reference J. J. Snyder "Paraxial ray analysis of a cat's-eye retro-reflector," Applied Optics V 14, No 8, (1975) pp. 1825. FIG. 12 illustrates an ASE spectrum of an embodiment of light source 800 and was produced using the same Anritsu OSA as mentioned above with the peak hold feature enabled and a 20 ms sample interval. The OSA resolution bandwidth was set to 1 nm, and 500 data points were acquired using a 20 ms peak hold feature of the Anritsu model MS9710A OSA. The full width at half-maximum was determined to be approximately 122 mn with an average output power of 15 mW.

The OSA peak hold feature was utilized to capture and average a large number of forward and backward scans from light source 800, which was operating at 16 kHz due to the inherently low temporal response of the spectrum analyzer. It should be noted that the spectral data acquired by the OSA will be distorted by the sinusoidal nature of the resonant scanner based tuning element of tuning section 103. This effect was minimized by setting the duty factor of light source 800 below 85% by increasing the scan amplitude beyond the tuning range of the laser, thus ensuring that the more linear portion of the sinusoidal scanner mechanism was utilized.

The average optical power measured after the laser output from an embodiment of light source 800 coupled into a single mode fiber was approximately 15 mW. For each complete cycle of the resonant scanner, the embodiment of light source 800 produces one forward (shorter to longer wavelengths) and one backward (longer to shorter wavelengths) sweep of its wavelength range. The forward sweep was found to be of slightly higher output power, approximately 10%. However, when the imaging properties of the forward and backward sweeps of the laser were individually tested, little or no differences could be seen in their quality. The peak output power was estimated to be about 30 mW, which is approximately the power achieved when light source 800 is static, and lasing at the approximate peak of the ASE curve is shown in FIG. 12.

Therefore, the 450 mm cavity length is short enough to allow sufficient time for each wavelength to reach its saturation power even when the cavity is being scanned at a 16 kHz repetition rate.

As illustrated above with respect to FIG. 8, a light source 800 according to the present invention includes a gain element 811 positioned in a multi-mode laser cavity with a fast tuning section 103. Each component that can be utilized for these elements has certain trade-offs to be considered. For each particular design specification, components in light section 101, transport medium 102, and tuning section 103 are chosen carefully while considering these trade-offs.

The choice of gain element 811 is based first on the desired center wavelength, total tuning range, and optical output power. Once materials that fulfill these major parameters are determined, the elements with the greatest tuning range and highest output power are typically selected as the first candidates. The tuning range is indicated by the spectral plot of the ASE for a gain element under consideration. The optical power is determined by the optical damage threshold of gain element 811, which is typically limited by the output facets of gain element 811. The length of gain element 811, along with it's index of refraction, will determine the free spectral range (FSR) of gain element 811. The FSR will be the characteristic frequency, or if converted to wavelength, the characteristic wavelength, of the ripple of the laser as previously described. For example, if the light source is intended to be used as an OCT light source, then this ripple from gain element 811 will, if it is large enough, create a ghost image. This ghost image (which is a reproduction of the main image just shifted in depth) will occur at a depth that is related to the optical path length of gain element 811. In the example gain element discussed in R. Huber et al., a ghost image at approximately 3.55 mm (1 mm times the 3.55 index of the material) is formed. While this may not be a significant issue in a highly scattering medium, such as the samples used in the Huber work, other application could suffer by presence of such a ghost image. Extending the length of gain element 811, for example to twice its original length, or 2 mm for example, could potentially shift the ghost image out of the range of the primary image of the imaging device utilizing that gain element 811.

Once the gain element material and length of gain element 811 are determined, the reflectivity of the facets of gain element 811 can then be chosen. Two basic approaches have provided reasonable results. One is to select a gain element with the highest possible reflectivity for the left facet (referring to FIG. 8, gain element 811); ideally this should be in the range of 90% or higher. The laser cavity would then be constructed with the mirror indicated as element 815 in FIG. 8 replaced with an partial reflector so as to act as the output coupler of the resulting laser. This is often the first preliminary choice in that it allows the system to be functionally tested so that the best output coupler reflectivity can be determined for a particular laser design. This approach is advantageous because it is normally easier to exchange element 815 than it is to change the reflectivity of the facet of gain element 811.

The second approach is to select a reflectivity of gain element 811 in the range of 20% and design the light source such that the output coupler is the left facet of gain element 811. In both cases, the other facet of the gain element 811 is AR coated, and ideally the residual reflectivity is reduced by also utilizing a curved waveguide. Once gain element 811 has been processed (coated using coating technology well known in the field of ECL production) to achieve the desired reflectivities, the gain element is tested using an OSA to determine its ASE spectrum as well as the degree of ripple present on the spectrum. If this ripple is found to have a wavelength period that matches the etalon modes of the cavity, and if the magnitude of the ripple is less than 5%, then the gain element is assumed to be appropriate if the wavelength range is also acceptable. If it is between 5% to 10%, then care needs to be taken to ensure that the rest of the cavity has fairly low losses and that the strength of the back coupling from the extend cavity back into the gain element is large. The actual intended application will set the upper limit on the ripple.

After the selection of gain element 811 has been made, then the collimating optic lens system 812 in FIG. 8, can be considered. Here the main factors are the optical performance of the lens system at the desired wavelength and over the desired wavelength range. Ideally the lens system should provide nearly diffraction limited performance; however because the light field emitted from most semiconductor gain elements is far from ideal, a broad range of optical elements can be utilized in lens system 812. There are many inexpensive molded glass aspheric lenses as well as GRIN lenses that have been tested and found to provide acceptable results. The other concerns would be the quality of the AR coatings and the any chromatic effects that could limit tuning range of light source 800. The focal length of the optic is chosen so that the collimated beam diameter provides for full illumination of the diffraction grating of tuning section 103 to provide the greatest wavelength resolution of the wavelength tuning section. The performance of both the diffraction grating and the performance of the achromatic doublet that will be described is effected by the beam diameter.

The transport medium 102, which can be free space of the cavity formed between the reflective surfaces of gain element 811 and mirror 815, can be used to adjust the space between adjacent longitudinal cavity modes; this adjustment is made to achieve the appropriate number of cavity modes per unit time passing through the filter function of the cavity as it tunes, as well as providing for a sufficient number of modes falling within the filter function for a given configuration of the wavelength tuning and selection section. With the overall coherence length being roughly determined by the width of the filter function formed in the cavity, the stability of the laser, the uniformity of the coherence length across the tuning range, the intensity noise, as well as the ripple can all be effected by the choice of the overall length of the cavity. Typically a short cavity length can be achieved while ensuring the design goals of the light source. The resolution of the wavelength tuning and selection section was a significant factor in the ability to shorten the cavity length.

Next diffraction grating 813 is chosen. The size of grating 813 as utilized in FIG. 8 is typically limited by the mass that the high speed resonant scanner 817 can support. Because the output beam from gain element 811 is typically elliptical, diffraction grating 813 can either be chosen to have an aspect ratio that makes maximum use of the available mass budget for the grating, or the beam shape can be altered with, for example, an anamorphic prism pair. The R. Huber et al. publication did not require the additional complexity of beam shaping optics because the beam shape and large angle of incidence on the grating provided for good utilization of the available grating area. Of primary concern when picking a grating is its efficiency across the wavelength range of interest. Additionally it should be confirmed that the polarization of the incidence light field is aligned with the preferred polarization of the diffraction grating, if in fact it has one. The ruling density can be chosen so that the diffracted light field can be swept across the optical axis defined by the achromatic lens and the slit/mirror assembly. Additionally, the desire to constrain the lasing action to approximately 80% to 85% of the scan time further limited the choice of ruling densities, which would ideally be made as high as possible so as to provide the narrowest possible filter function for the cavity. This filter function is further defined by the choice of the slit width. A wider slit generally results in a larger output power but would also generally result in a shortened coherence length for the light source.

The next component after the grating in FIG. 8 is the achromatic doublet lens 814. The achromatic doublet accepts the collimated but dispersed beam from the diffraction grating 813 and focuses a particular wavelength that is traveling along the optical axis through the slit onto the high reflector that forms the back end-mirror of the cavity of light source 800. Since the quality of the achromat in part determines the shape filter function of the wavelength selection section this element should provide near diffraction limited performance across the wavelength range of interest. Due to the geometry, whereby only the light that passes through the system along or very near to the optical axis is able to return to the gain element for amplification, this lens needs to have very good on-axis performance over a broad wavelength range. This was achieved by designing the achromat using a set of wavelengths that spanned the wavelength range of interest. Additionally the quality of the AR coatings on the achromatic lens system 814 was determined to play an important role. High quality AR coatings on both of the lenses of achromatic lens system 814 were utilized in order to ensure low losses in the external cavity.

As for the focal length of achromatic lens system 814, a range of focal lengths were tested, with good performance being achieved across a range from about 15 mm to about 50 mm. The shorter focal lengths were found to provide slighter better overall performance in terms of wavelength range, power, and coherence length. While the light source described in Huber et. al. had a 45 mm achromatic lens system, better results are possible using the shorter focal length optics. Choice of achromatic lens system 814 can also consider the largest diameter beam that can be supported by the cavity. Typically, the larger the diameter the better the performance. However, if a shorter focal length achromatic lens is used, then their small diameters need to be considered. The design challenge here is to provide the greatest degree of wavelength selectivity while introducing the lowest possible loss at the center wavelength of the filter.

The next component to be considered in FIG. 8 is slit 816. This element allows the central wavelength of the filter function formed in light source 800 to pass while blocking other wavelengths. From design simulations as well as from experimentation, silts with widths in the range of 5 µm to 15 µm were found to provide the best overall results, with acceptable power and coherence length, for slit 816. When the focal length of achromatic lens system 814 was near the short end of the range, then the smaller width slits work better. Slits are commercially available from National Aperture and were laser machined in metal foil and blackened so as to minimize unwanted back reflections.

Mirror 815, to which slit 816 is bound, ideally would have substantially 100% reflectivity across the wavelength range of light source 800. This goal was nearly achieved by using a high quality broadband mirror provided by Thorlabs, Inc.

The use of the cat-eye configuration in tuning section 103, as noted above, provides a design with good performance over a broad range of wavelengths, while also providing a system that is relatively tolerant of misalignment as previously noted.

Other embodiments of light sources according to the present invention are illustrated in FIGS. 1-5. As described below, a slit mirror is understood to mean a narrow width slit shaped reflector e.g. a mirror, a transparent slit with a mirror directly behind or a transparent slit with a reflector behind together with an optical system which retro reflects the radiation back through the slit. Further, the term light in context of optical radiation stands for visible, ultraviolet or infrared radiation.

FIG. 1 illustrates an embodiment of light source 100 according to the present invention. Light source 100 is formed from a tunable laser that extends from a first end-reflector 11 to second end-reflector 19. A presumed out coupling of part of the optical power is done by conventional methods, e.g., at first end-reflector 11 or at the second end-reflector 19 or by using the reflection of the primary incident light or the retro reflected dispersed light from the dispersive element 16 or by inserting an optical beamsplitter into the beam path within the laser cavity of light source 100. The radiation is generated in the light generating and optical gain medium 12. Light then passes through beam converting optics 13. The collimated outgoing beam from 13 enters propagation medium 14. The radiation may be propagating freely in the medium or be bound to a channel e.g. an optical fiber. Through a proper choice of medium the optical length of the cavity and hence the longitudinal mode distance in the laser device can be selected. The collimated beam α, which leaves the propagation medium 14 hits dispersive element 16 either directly or after having been deviated by a moving reflector. Dispersive element 16 is rotated with a fast mechanical rotator 15. Light from dispersive element 16 is coupled into focusing optics 17 onto slit mirror 19, which is positioned in the focal plane of focusing optics 17.

Figure 2:
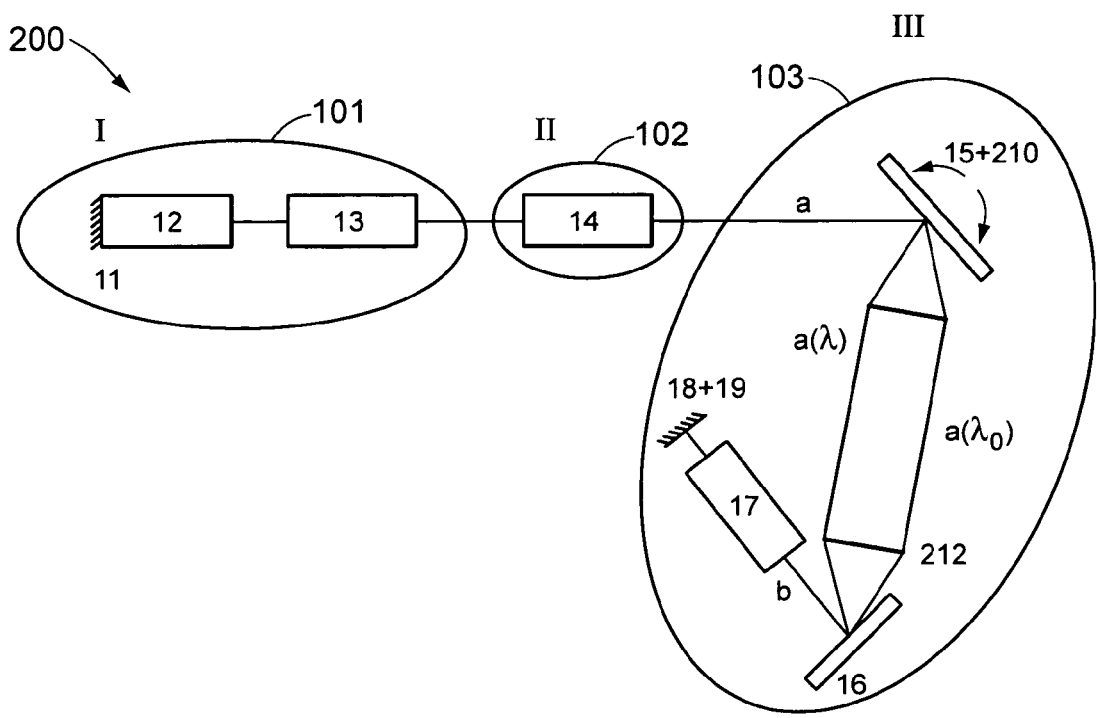
FIG. 2 illustrates another embodiment of laser system according to the present invention.

FIG. 2 shows another embodiment of light source 200 according to the present invention. As shown in FIG. 2, light from transport medium 14 is incident on a scan mirror 210 that is mounted on a fast mechanical rotation scan arrangement 15. Light from scan mirror 210 is coupled into achromatic lens 11, which is positioned such that scan mirror 210 is in its focal plane. Light from achromatic lens 11 is coupled into achromatic lens 212, which has a focal length such that scan mirror 210 is at the combined focal length of lenses 212 and 211. Grating 16 is placed approximately at the focal length of lens 212 from lens 212. The quantity $\alpha(\lambda_0)$, then, is a collimated beam of wavelength $\lambda_0$;

The dispersed beam b, which is a collimated beam of all wavelengths, in FIG. 1 and FIG. 2, is focused onto the filtering reflective slit mirror 19 by lens system 17. The wavelength is scanned across the slit mirror 19 by the moving dispersive element 16 in FIG. 1, respectively by the moving reflector 210 in FIG. 2.

In the embodiment shown in FIG. 1, the dispersive element 16 rotates by means of a fast mechanical scan arrangement 15. The dispersed radiation b is focused on the end slit mirror 19.

In the embodiment shown in FIG. 2, the incident collimated beam a is moved angularly by the fast rotating mechanical reflector arrangement a scan reflector 210 formed of a mirror mounted on a fast mechanical rotation scan arrangement 15 and the optical system formed by lenses 211 and 212. The collimated beam a hits a stationary dispersive element 16 at different incident angles, depending on the momentary rotational position of the mirror 210. The dispersed radiation, which is retro reflected by the end slit mirror 29, thus varies in wavelength with the fast rotation of mirror 210.

Figure 3:
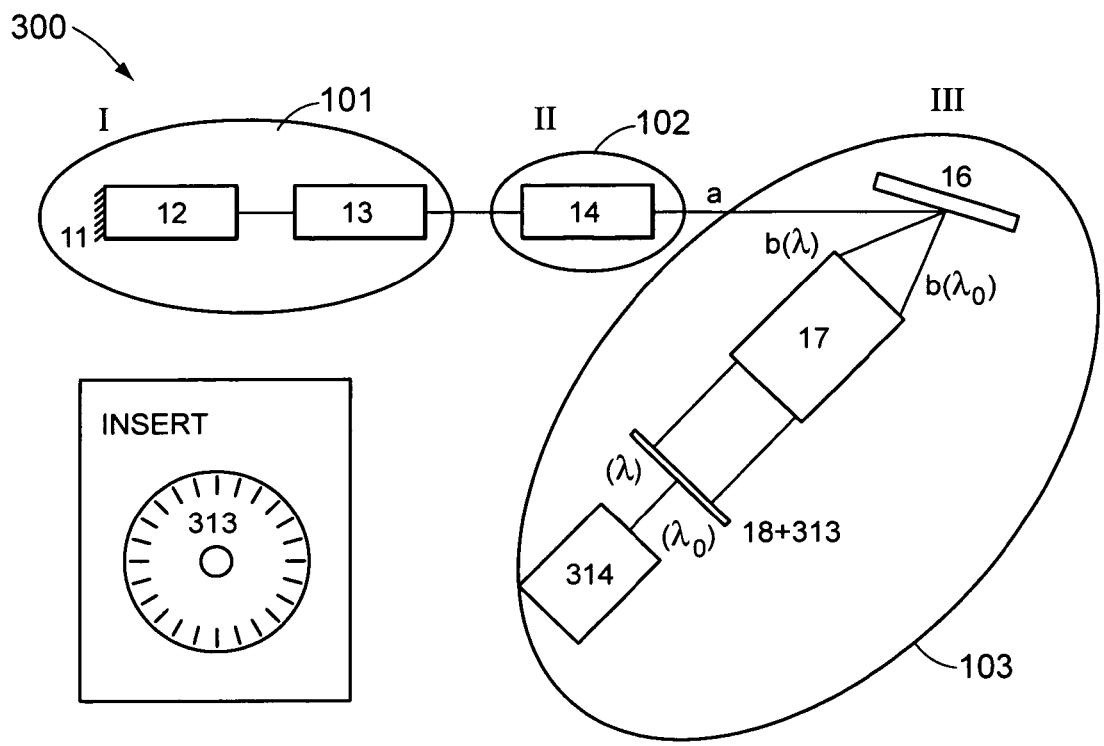
FIG. 3 illustrates another embodiment of laser system according to the present invention.

In the embodiment shown in FIG. 3, the stationary dispersive element 16 directs the collimated dispersed beam b in an angle that depends on the wavelength λ. A spectrum is formed in the focal plane 18 of the focusing optics 17. The spectrum in focal plane 18 is scanned by the slit mirror assembly 313 fixed on a rotating wheel. Slit mirror assembly 313 is a wheel with a peripheral regular pattern of slit mirrors that is placed in the focal plane 18 of focusing optics 17. The moving strip mirrors constitute the second end-reflectors of the optical cavity. Slit mirror assembly 313 is driven by a drive motor 314.

Figure 4:
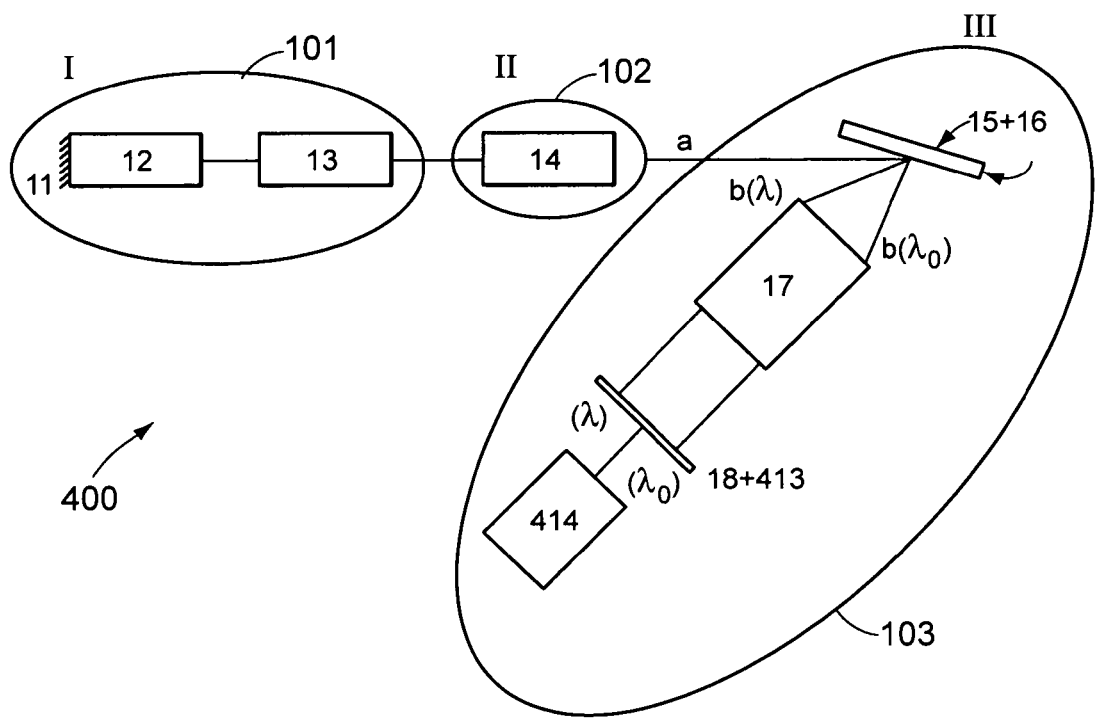
FIG. 4 illustrates another embodiment of laser system according to the present invention.

In the embodiment shown in FIG. 4, a composite of the embodiments illustrated in FIGS. 1 and 3 is used. This arrangement makes it possible to use one and the same device for the two different scanning modes of FIGS. 1 and 3. In the scanning mode, dispersive element 16 is scanning while one of slit mirrors 313 on the wheel is used as a stationary end slit mirror. In the scanning mode of another embodiment, the dispersive element 16 is stationary while the wheel with the slit mirror assembly 313 is spinning.

Figure 5:
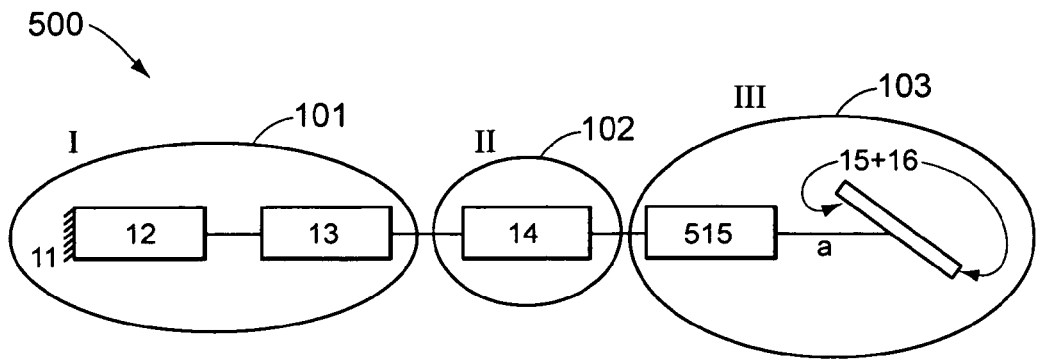
FIG. 5 illustrates another embodiment of laser system according to the present invention.

In the embodiment shown in FIG. 5, the spectral-optical-filtering device is a slit or pinhole internal to a lens system 515 that is deposited in front of the dispersive element 16. Lens system 515 is an optical lens system with an internal spectral filtering slit or pinhole. In some embodiments, lens system 515 can be formed from a spectral filter in the form of a lens pair, separated by the sum of their focal lengths with a narrow slit in the range of about 5 μm to about 25 μm placed at the focus of the first lens is used. And hence for this configuration, the spectral filtering element can be considered to be embedded within the second section 102. The arrangement of the dispersive element shown in FIG. 5 can be of the type known as a Littrow configuration whereas the other four preferred embodiments can use a modified Littman type configurations.

The embodiments of laser system illustrated in FIGS. 1-5 all show the same arrangement of parts for the first and second sections, with just the third section changing with each new configuration. In some embodiments, the first optical surface 11 indicated in FIG. 1, and identified as the "First end-reflector of the cavity," could also be a low reflectivity output surface of the gain element with an additional lens similar to lens 37 of FIG. 3, which would act to collimate the output of the optical radiation from surface 11 of gain medium 12. A separate end-reflector can be coupled to gain element 12 to form the cavity.

In some embodiments, the moveable wavelength dispersive device 16 shown in FIG. 1 and the scan mirror 210 shown in FIG. 2 both are placed on fast angular scanning devices 15. The angular scanning device 15 may suitably be driven by a galvanometer or similar mechanism in a resonant mode, a coil induction mechanism, a piezoelectric mechanism, an electro-optic beam deflector, an acousto-optic beam deflector, an MEMS based beam deflector, or an electrical motor mechanism.

In experimental tests of an embodiment of light source 100 such as that shown in FIG. 1, a resonant scanner was used to rotate an optical grating. The output of the second section was chosen to be a free space beam that was collimated such that the collimated beam nearly fully illuminated a diffraction grating 16 that was included in third 103 section for this embodiment. The third section 103 included a resonant scanner 16, a diffraction grating 15, a lens 17, and a narrow 10 μm slit mirror 19, which is a 10 μm slit attached directly to a mirror. One family of resonant scanner 16 that was successfully tested for utilization in embodiments of the present invention is the model SC-30 type from Electro-Optical Products Corp. of Glendale N.Y.; the range of scanners tested provided laser repetition rates in the range of 10 KHz to 24 KHz. Diffraction gratings 16 were mounted directly onto the moving portion of resonant scanner 16 in place of the mirrors that are typically offered on such devices. Gratings 16 were fabricated on substrates that were approximately 1 mm thick, and ranged from about 6 mm high by about 8 mm wide to about 5 mm high to about 6 mm wide. The actual size was determined by the specific resonant frequency of the resonant scanner, as the scanner frequency increases the mass of the grating was reduced. The ruling density of the gratings tested ranged from 800 lines per millimeter to 1100 lines per millimeter; in each instance the length of section two of the laser could be adjusted to maximize the dynamic coherence length of the laser as well as the other operating parameters of the laser such as power, wavelength tuning range, stability, optical output noise, and suppression of unwanted etalon effects within the gain element.

The collimated light field from section two 102 would enter section three 103 and be incident upon the diffraction grating 16. The angle of incidence was maximized so as to illuminate the maximum area of the grating 16 and to provide the greatest angular dispersion of the light generated by the broadband gain element 12 of section one 101. The dispersed light was then incident upon by a high quality achromatic lens 17, and thus the dispersed light field was then focused down onto the narrow slit and mirror assembly 19. The lenses tested with good results were either high quality achromats designed for use in the wavelength range of the gain medium or glass aspheric lenses. All the lenses utilized high quality multilayer antireflective coatings to minimize the intra-cavity losses. The focal lengths successfully used were in the range of about 10 mm to about 50 mm for the achromatic lenses, and in the range of about 6 mm to about 8 mm for the aspheric lenses.

The final optical component of this section, slit mirror 19, included a narrow slit cut into a thin foil that was ⅜" in diameter. The slit widths that were successfully tested were in the range of 5 μm to 25 μm in width and 3 mm in height. The slit was then mounted in direct contact with a high quality mirror to form slit mirror 19. The mirror that provided the best results were commercially available mirrors that feature a broadband dielectric coating that was highly reflective across the wavelength range of interest. See Thorlabs model number BB1-E04 for the 1.3 μm wavelength range and BB1-E03 for the 800 nm wavelength range. The lens was placed approximately 10 to 20 mm from grating 16, the distance between the lens 17 and grating 16 was not found to be very important for the successful operation of the laser; however in general a slight improvement in the coherence length and output power was found the closer that lens 17 was placed to grating 16. With the resonant scanner 15 off, the lens 17 was placed on the optical axis of the system. In this case, the optical axis is defined as the path defined by the center wavelength of the spontaneously emitted light which is emitted by the broadband gain element 12 as it propagates away from the grating 16 in a direction defined by the grating characteristics and the angle of incidence for the incoming light field. The lens 17 thus positioned acts to focus the light field to an area that is one focal length away. At this point the slit and mirror assembly was placed so that it acted as both a spectral filtering element as well as the retro-reflector for the laser resonator.

With proper alignment and full electrical power to the first element, the embodiment of light source 100 described above will lase. When the resonant scanner 16 is switched on, light source 100 would begin to scan across the wavelength range determined by the gain medium 12 and the cavity losses. When lasing, the output power was larger than 15 mW for one of the gain elements tests. The tests illustrated a tuning range greater than 138 nm and a coherence length ($L_c$=2×HWHM of the fringe contrast measurement within a Michelson interferometer) measured to be longer than 11 mm. A number of gain elements were tested successfully. The actual gain element chosen will depend on the desired center wavelength, optical power, and tuning range required. Semiconductor gain elements are readily available from a number of suppliers (e.g., InPhenix, Inc., of Livermore, Calif.).

A comparison between the embodiments illustrated in FIGS. 1 and 3 results in the following observations. The optical arrangement light source 100 illustrated in FIG. 1 is obviously much simpler than that of light source 200 illustrated in FIG. 2. On the other hand the size of the dispersive reflector 16 that can be moved rapidly is rather limited. Commercial resonant scanning mechanisms operating in the range of 5 kHz to 20 kHz are limited in the size of the optical element they can support. For the resonant scanners used in these experiments, the diffraction gratings utilized for dispersive element 16 were approximately 5 mm high, and 8 mm wide by 1 mm thick for the 5 kHz scanners and were smaller for the higher frequency scanners. This limited the number of grating lines that can be illuminated and hence also limited the resolution of the grating that can be obtained. There is not a corresponding limitation in the embodiment shown in FIG. 2 since a nearly perpendicular incident beam a can be used on a scanning reflector as opposed to the necessarily very oblique incidence on the scanning grating. The stationary grating utilized in light source 200 illustrated in FIG. 2 allows for a much larger grating area than the rotated grating utilized in light source 100 illustrated in FIG. 1.

The slit mirror 19 used as a filtering end mirror is an intricate component to manufacture. In experiments, a slit in a metal foil in contact with an underlying mirror film has been successfully used. The narrower the slit is made, the better the filtering action becomes. The intensity of the laser radiation, however, naturally goes down at the same time. In experiments, slit mirror widths in the range 5-25 μm have been found optimal with respect to the balance of filtering and intensity performance; however other slit widths can be utilized.

If a slit mirror with adjustable width is advantageous for filtering, a spectrometer slit together with a retro reflecting optical system behind the slit can be used. The optical system shall image the slit onto itself. A planar mirror with a collimating lens or a planar mirror and two lenses is positioned to collimate the light from the slit and then focus it and then reflect it with the mirror placed at the focus of the second lens. Alternatively, a concave mirror may serve this purpose. Additionally, two movable non-transparent plates could be held in place on top of or in close contact to a mirror. Two razor blades were test for this purpose, one attached to a translation stage, and one fixed to the surface of the mirror; this approach provided acceptable results.

In the embodiments illustrated in FIGS. 3 and 4, a rotating filtering and retro reflecting device 13 is utilized. A number of slit mirrors are positioned with an equal separation close to the periphery on a spinning wheel; attaching thin slits machined in metal foil to a 50 mm diameter mirror with the aid of an alignment fixture provided a workable solution. A shaft was then attached to the back of the mirror and slit assembly to provide a completed retro-reflecting wheel 13. The wheel is driven by an electric motor that functions as drive motor 14. The scan time, the time it takes for one of the slit mirrors to scan the relevant wavelength range in one direction, can not be made as short as with the fast resonant scan mechanisms that may be used in the embodiments shown in FIGS. 1 and 2. An advantage with the motor driven spinning wheel, as opposed to the faster resonant scan mechanism, is that that the scan time can be varied continuously.

The combination of the two scanning principles is illustrated in FIG. 4. A simultaneous scanning provides a powerful tool for acquiring images at slower speed for applications that would otherwise result in data sets that are unmanageably large. Additionally, the extended coherence length of the slower scan speeds are of potential value when utilizing the system in OCT applications; inside, for example, the esophagus, where the distance between the tissue and the probe could vary dramatically the extended coherence length would allow for a larger imaging range.

In the embodiment shown in FIG. 3, the third section 103 includes stationary grating 16, a lens 17, and a rotating multi slit mirror 313. The ruling density of the gratings 16 tested ranged from 800 lines per millimeter to 1070 lines per millimeter. In each instance the length of the second section of the laser, i.e., the length of the cavity, could be adjusted to optimize the dynamic coherence length, power, stability, optical output noise, and suppression of unwanted etalon effects within the gain element. The collimated light field from the second section 102 entered the third section 103 and was incident upon the diffraction grating 16. The angle of incidence was maximized so as to illuminate a maximum area of the grating 16 and to provide the greatest angular dispersion of the light generated by the broadband gain element 12 of section one 101. The dispersed light is captured by a high quality lens 17 and focused to an image plane 18. In the image plane, the light of a given wavelength is represented by a vertical line; moving across this image plane different wavelengths are encountered.

The lenses that tested with good results were high quality achromats designed for use in the wavelength range of the gain medium. All the lenses utilized high quality multilayer antireflective coatings to minimize the intra-cavity losses. The focal lengths successfully used were in the range of 30 mm to 50 mm. Single lens configurations as well as multi lens configurations were tested; the multi lens configurations provided slightly better performance in term of optical power and coherence length. The final optical component of this section was comprised of a multi-slit mirror 313. The slit mirror had 20 reflective slits, each 20 μm wide. The reflective surface was protected aluminum. About 700 μm of material from either side of the 20 μm reflective slit had been removed by a dicing saw; the remaining reflective area between the reflective slits was covered with black masking tape. Other kinds of slit mirrors had been tested with good results, like several slits machined into thin foil disks mounted on an Al-protected mirror. The multi slit mirror was mounted on a brushless servomotor P/N TG2385-Delta, Thingap Corp of Ventura Calif., which was driven by an Advanced Motion Controls Brushless servo amplifier P/N B30A8. The nominal current was 4 A current at 45 V. The power supply used was a bench top BK precision 60 V 6 Amp DC power supply.

The number of slits that can be used is set by the combination of chosen diffraction grating 16, focal length of the lens 17, diameter size of the lens 17, the wavelength range of the gain medium 12 in the cavity, and the desired duty factor of the light source.

Lens 17 can be Thorlabs achromat lens AC254-050-C positioned 38 mm from the grating 16 (point on grating that beam hits to the front edge of the lens cell). The distance from the front edge of the lens cell (SM1L05) to the reflective slit was 50 mm and gave a 3 dB point of 111 nm tuning range when the laser current was 299.7 mA, and the motor was running at 132

Hz. The coherence length of the resulting laser was measured to be between 17.2 and 28.7 mm, depending on scan time.

There is a connection between scan time and coherence length of the radiation generated. In experiments with the multi-slit mirror, described above, this relation was studied. The coherence length of the radiation as a function of scan time was measured with a fiber based Michelson interferometer. FIG. 6 shows the coherence length in mm plotted vertically and the scan time in μs horizontally. The graph shown in FIG. 6 clearly shows a linear decay of the coherence length with decreasing scan time.

The optical systems 17 shown in FIGS. 3 and 4, respectively, should be of very good achromatic quality to give an almost perfectly flat focal area. The same is true for lens system formed by the lenses 211 and 212 and its ability to realize a planar focal area in between the two lenses.

The embodiment shown in FIG. 5 illustrates the least complicated configuration of embodiments of light source according to the present invention and is apt to give a high output energy. In an experiment, the two lenses of lens system 515 utilized in an embodiment of FIG. 5 were Thorlabs C170TM-C, f=6.16 mm and the slit between the lenses was 10 μm wide. A continuous power of 22 mW was reached, and the coherence length was measured to be approximately 2 to approximately 4 mm depending on cavity length. The wavelength tuning range was around 130 nm.

Figure 7:
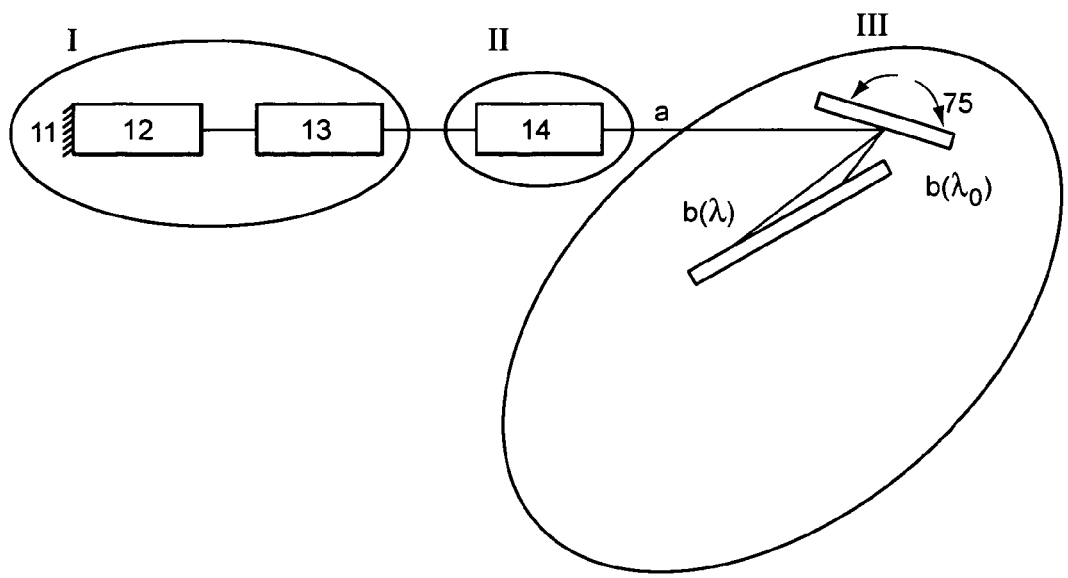
FIG. 7 illustrates another embodiment of laser system according to the present invention.

FIG. 7 illustrates another embodiment of compact scanning laser according to the present invention. In the embodiment shown in FIG. 7, a scanning mirror 15 that deflects the beam to a grating (indicated by $b(\lambda)$) that also operates as an end mirror in a Littrow configuration. In some embodiments, a spectral filter section can also be used as seen in FIG. 7. The embodiment of light source illustrated in FIG. 7 departs significantly from the embodiments illustrated in FIGS. 1-5 and 8 in that there is a substantial change in the overall cavity length that is a result of using a diffraction grating in a Littrow orientation as the second end-reflector of the cavity. As the collimated beam is scanned across the diffraction grating 16 by the scan mirror 75, which includes a mirror mounted on a fast mechanical rotational scan arrangement, the distance between the center of the scan mirror and the diffraction grating 16 changes as can be clearly seen from FIG. 7. The '355 patent utilizes a similar geometry; however, the '355 patent balances the distance between the scan mirror and the grating, the distance between the scan mirror to the front facet reflector, and the angle of incidence onto the grating at the center wavelength in order to provide first order compensation for the axial mode tuning. The '355 patent provides an analysis of the system that can be used to ensure that the laser can be adjusted and/or configured to operate in nearly a single mode across its tuning range, thus avoiding nearly all of the many tens of thousands of mode hops-as they are know in the art of ECL systems-that are encountered. Operating at the single mode point requires substantial effort, and, unless the system also has a means of removing the residual mode hops that are left after the first order correction has been made, the dynamic coherence length is erratic and not uniform across the entire tuning range of the light source. In some implementations of the design shown in FIG. 7, these same distances were intentionally adjusted so that a substantial number of mode hops, estimated to be many thousands or tens of thousands, are introduced as the system is tuned. This approach provided for a coherence length that was substantially shorter than that possible with a truly mode hop free tunable laser, as they are know in the art; however it ensured that we were able to meet our design objective of providing a robust laser with a coherence length greater than a few millimeters. In some embodiments of light source as illustrated in FIG. 7, a coherence length of up to about 4 mm was obtained. The '355 patent has the cavity geometry carefully balanced such that the parabolic increase in the longitudinal mode number N has a minimum that occurs at the center wavelength of the laser. System that are configured so that N as a function of wavelength did not pass through a minimum within the tuning range of the system perform better. This configuration ensured that there was a significant change in N per unit change in wavelength as the laser was swept through its range of wavelengths. Operating with geometries that provided this change in N proved to provide a highly stable coherence length across the entire tuning range of the laser, whereas operating the same laser balanced to provide the first order compensation as per the '355 patent did not generally offer this same performance. Further, a multimode system performs better than the single mode system disclosed in the '355 patent.

In general, imaging applications such as OCT function best with a light source according to the present invention that has a coherence length of greater than about 3 mm, a tuning range in excess of 5% to 10% of the center wavelength, a power of about 0.5 mW or greater for lasers operating in the 850 nm range and about 5 mW or greater for lasers operating in the 1300 nm range, scan repetition frequencies of greater than about 10 kHz, and small ripple. Additionally the mode spacing, as well as the number of modes that can lase simultaneously, needs to be balanced such that the power fluctuations or intensity noise can be substantially removed via a balanced detection scheme and that the coherence length does not vary substantially as the system scans. In large part the coherence length depends on the filter function of the cavity, which in turn is most easily adjusted by changing the filter function of the fast wavelength tuning section. The stability of the coherence length over the tuning range can be important in some utilizations and is adjusted by changing the spacing as well as the number of modes that are supported by the cavity. The tuning range is dependent on the gain element, component losses, wavelength dependent component losses, scanner amplitude (whether the scanner amplitude is sufficient to cover a broad range of frequencies produced by the gain element), and the diffraction grating characteristics or the characteristics of whatever wavelength tuning and filtering element is chosen. If the scanning element provides a sinusoidal scan, then it is useful if the amplitude of the scanning element is broad enough to cover about 120% of the bandwidth of the gain element. The grating design is dependent on the ruling, blazing, angle of incidence, and area of illumination.

The cavity length can be short, medium, long, or may vary. Short cavities have wider mode spacings and hence few modes for a fixed filter function; however long cavity lengths limit the scan rates because of the round trip time for the photons in the cavity. The power of the laser is dependent on the optical gain element, damage thresholds of the optical components in the cavity, the operating frequency, and cavity losses. The spacing of the modes can be well defined and depends on the optical path length of the cavity. The number of modes supported in the cavity depends on the filter function, loss in the cavity, gain, and the alignment of the cavity. The filter function is dependent on the geometry of the cavity, the slit width of the slit-mirror, the diffraction grating, and the waveguide. The scan speed of the light source is dependent on the scanner, the diffraction grating and the angle of incidence of the light onto the grating, and the wavelength range of the laser.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A tunable multimode laser light source, comprising:
an optical cavity formed between two reflectors, the optical cavity supporting a plurality of optical modes and having a cavity length;
an optical gain medium positioned within the optical cavity; and
a tuning section positioned in the optical cavity, the tuning section being coupled to receive light from the gain medium and tune between modes of the plurality of optical modes,
the tuning section including a wavelength selection device a distance from the optical gain medium, the cavity length being held substantially constant when the wavelength selection device is scanned, the tuning section having a tunable filter function
wherein the wavelength selection device has a filter function width that allows a plurality of longitudinal modes to simultaneously lase within the optical cavity, the simultaneous lasing forming a wavelength-tuned, multimode laser having a coherence length of greater than about 2 mm, and
wherein the tuning section causes the average laser wavelength to change continuously with new longitudinal cavity modes entering from the leading edge of the tunable filter function as old longitudinal cavity modes fall off from the trailing edge of the tunable filter function.

2. The source of claim 1, wherein the tuning section is capable of tuning over a tuning range of greater than about 5% of a center wavelength of the optical gain medium and wherein the wavelength scan frequency is between about 20 Hz and about 50 kHz.

3. The source of claim 1, wherein the tunable multimode laser light source has an output power of greater than about 0.5 mW.

4. The source of claim 1, wherein an average of the plurality of optical modes under a filter function of the cavity is dependent on the wavelength tuned by the tuning section.

5. The source of claim 4, wherein the tuning section changes between sets of modes included in the plurality of modes supported by the optical cavity.

6. The source of claim 1, wherein the tuning section holds the length of the optical cavity substantially constant.

7. The source of claim 1, wherein a length of a portion of the optical cavity is adjusted to offset a change in length introduced by the tuning section.

8. The source of claim 1, further including an optical propagation medium positioned in the cavity between the optical gain medium and the tuning section.

9. The source of claim 8, wherein the optical propagation medium is free space.

10. The source of claim 8, wherein the optical propagation medium is an optically transmissive liquid, gas, or solid.

11. The source of claim 8, wherein the optical propagation medium is an optical fiber.

12. The source of claim 1, wherein the optical gain medium is a semiconductor gain element.

13. The source of claim 1, wherein the tuning section comprises
a dispersive element mounted on an optical scanner, the dispersive element receiving light from the gain medium;
a lens system coupled to receive light from the dispersive element; and
a slit-mirror optically coupled to the lens system, the slit mirror positioned in the focus plane of the lens system.

14. The source of claim 1, wherein the tuning section is a fast mechanical wavelength tuning section and includes a dispersive part, a spectral optical filtering part, and a reflector part.

15. The source of claim 14, wherein the reflector part is the dispersive part.

16. The source of claim 14, wherein the reflector part serves as a second end-reflector of the cavity.

17. The source of claim 14, wherein the reflector part is combined with the spectral optical filtering part.

18. The source of claim 1, wherein the tuning section is a fast mechanical wavelength tuning section and includes a dispersive part, a spectral optical filtering part, an optical imaging part, and a reflector part arranged so that the optical imaging part and reflector part are configured in an optical cat-eye arrangement.

19. The source of claim 1, wherein the wavelength selection device is a grating.

20. The source of claim 5, wherein, as a set of modes is tuned in the optical cavity, a wavelength is tuned over a wavelength range in a continuous manner.

* * * * *